United States Patent [19]

Watanabe

[11] Patent Number: 5,422,338
[45] Date of Patent: Jun. 6, 1995

[54] A LAYER-BY-LAYER VAPOR DEPOSITION METHOD FOR FORMING A HIGH TC SUPERCONDUCTOR THIN FILM DEVICE

[75] Inventor: Yukio Watanabe, Machida, Japan

[73] Assignee: Mitsubishi Chemical Corporation, Tokyo, Japan

[21] Appl. No.: 180,792

[22] Filed: Jan. 10, 1994

Related U.S. Application Data

[63] Continuation of Ser. No. 713,277, Jun. 11, 1991, abandoned.

[30] Foreign Application Priority Data

Jun. 11, 1990 [JP] Japan .................. 2-152178

[51] Int. Cl.$^6$ .................................. H01L 39/24
[52] U.S. Cl. ........................... 505/329; 505/473; 505/474; 505/190; 505/702; 427/62; 427/255.7
[58] Field of Search ............ 505/329, 330, 190, 191, 505/473, 474; 257/31, 35; 427/62, 63, 255.7

[56] References Cited

U.S. PATENT DOCUMENTS

| 5,034,374 | 7/1991 | Awaji et al. .................. 357/5 |
| 5,061,971 | 10/1991 | Takemura ..................... 357/5 |
| 5,300,484 | 4/1994 | Otani .......................... 505/473 |

FOREIGN PATENT DOCUMENTS

| 0422407 | 4/1991 | European Pat. Off. |
| 2-83986 | 3/1990 | Japan .................. 357/5 |
| 2-114576 | 4/1990 | Japan . |
| 3-68180 | 3/1991 | Japan . |
| 3-166776 | 7/1991 | Japan . |

OTHER PUBLICATIONS

Nakayama et al, "Epitaxial Growth of Bi–Sr–Ca–Cu–O Thin Films by Molecular Beam Epitaxy Technique with Shutter Control", Jpn. J. Appl. Phys. 28(10) Oct. 1989, pp. L1809–L1811.

Li et al, "Observation of Resistive and Magnetic Anomalies at 90–180K in Artificially Layered $Ca_{1-x}Sr_xCuO_2$ Thin Films Grown by Laser Molecular Beam Epitaxy", Jpn. J. Appl. Phys. vol. 31 part 2, No. 7B Jul. 1992, pp. L934–L937.

J. M. Triscone, et al. "Y–Ba–Cu–O/Dy–Ba–Cu–O Superlattices: A First Step Towards the Artificial Construction of High–Tc Superconductors", Physical Review Letters, vol. 63, No. 9, Aug. 28, 1989, pp. 1016–1019.

M. Kanai, "Superconducting Superlattices" Verification of Two–Dimensional Nature in High $T_c$ $Bi_2Sr_2(Ca_{1-x}Y_x)Cu_2O_8$ Superconductors, Appl. Phys. Lett. 57(2), 9 Jul. 1990, pp. 198–200.

J. M. Tarascon et. al. "Structural & Physical Properties of the Metal (M) Substituted $YBa_2Cu_{3-x}M_xO_{7-y}$ Perovskite", Physical Review B. vol. 37, Nov. 13, 1 May 1988, pp. 7458–7469. S. X. Dou, et al. "Stability of Superconducting Phases in Bi-Sr-Ca-Cu-O and the
(List continued on next page.)

*Primary Examiner*—Roy V. King
*Attorney, Agent, or Firm*—Oblon, Spivak, McClelland, Maier & Neustadt

[57] ABSTRACT

A thin film device comprising a substrate and an oxide superconductor film formed thereon, wherein said oxide superconductor film comprises atomic monolayers each composed of at least one kind of element of the oxide superconductor, which are deposited substantially in a vertical direction to the substrate so that the pereodicy of the lattice structure of the oxide superconductor is substantially maintained, and at an intermediate portion of the oxide superconductor film, at least a part of the atoms of the oxide superconductor is substituted by other element in the lattice structure of the oxide superconductor to form a non-superconductor interlayer, and the pereodicy of the lattice structure of the oxide superconductor film is substantially maintained across the interface between the oxide superconductor and said non-superconductor interlayer.

6 Claims, 8 Drawing Sheets

OTHER PUBLICATIONS

Role of Pb Doping", Physical Review B, vol. 40, No. 7, 1 Sep. 1989, pp. 5266–5269.

Appl. Phys. Lett. 56(4): p. 391 (22 Jan. 1990), Venkatesan et al.

Appl. Phys. Lett. 55(19): p. 2032 (6 Nov. 1989), Rogers et al.

ISTEC Journal 2(3): p. 19 (1989), (Kawai).

Phys. Rev. B 37(13): p. 7458 (1 May 1988), Tarascon et al.

Jpn. J. Appl. Phys. 29(12):L2219 (Dec. 1990), Kasai et al.

Appl. Phys. Lett. 57(2): p. 198 (9 Jul. 1990), Kanai et al.

Appl. Phys. Lett. 58(13): p. 1443 (1 Apr. 1991), Tabata et al.

Physical Review Letters, vol. 64, No. 7, 12 Feb. 1990, New York pp. 804–807. J. M. Triscone, et al: "YBa2-Cu3O7/PrBa2Cu3O7 Superlattices: Properties of Ultrathin Superconducting Layers . . . ".

IEEE Transactions On Magnetics vol. 25, No. 2, Mar. 1989, New York pp. 2534–2537. Tonouchi, M. et al: "Multiple Heteroepitaxy and Superlattice Formation of LnBaCuO/YBaCuO System".

Applied Physics Letters vol. 55, No. 19, Nov. 6, 1989, New York pp. 2032–2034. Rogers C. T. et al: "Fabrication of Heteroepitaxial YBa2Cu3O7-x-PrBa2Cu3O7-x--YBa2-Cu3O7-x Josephson Devices . . . ".

Physical Review Letters vol. 63, No. 9, Aug. 28, 1989, New York, pp. 1016–1019. Triscone, J. M. et al: "Y-Ba-Cu-O/Dy-Ba-Cu-O Superlattices: a first step towards the artificail construction . . . ".

Patent Abstracts of Japan, vol. 124, No. 23 (E-680) 9 Nov. 1988 & JP-A-63 160 273 (Fujitsu).

Patent Abstracts of Japan vol. 142, No. 36 (C-072) 18 May 1990 & JP-A-2 059 403 (Hitachi).

ature $Tc>90K$), a Bi—Sr—Ca—Cu type (critical temperature $Tc=80$–$110K$), and a Tl—Ba—Ca—Cu—O type (critical temperature $Tc=90$–$120K$) are known.
LAYER-BY-LAYER VAPOR DEPOSITION METHOD FOR FORMING A HIGH TC SUPERCONDUCTOR THIN FILM DEVICE This application is a Continuation of application Ser. No. 07/713,277, filed on Jun. 11, 1991, now abandoned.

BACKGROUND OF THE INVENTION

1. Field of the Invention

The present invention relates to a thin film device and more particularly to a thin film device wherein an oxide high temperature superconductor is employed and which is useful for example in making a lamination-type Josephson device.

2. Discussion of the Background

In recent years, a research has been actively conducted on an oxide superconductor containing Cu—O layers in the crystal structure, as a superconductor which may be substituted for conventional superconductors of the Nb or A15 type compound ($\beta$-W type crystal structure) such as $Nb_3Sn$ or $Nb_3Ge$.

As a typical material for such an oxide superconductor, a Y—Ba—Cu—O (YBCO) type (critical temperature $Tc>90K$), a Bi—Sr—Ca—Cu type (critical temperature $Tc=80$–$110K$), and a Tl—Ba—Ca—Cu—O type (critical temperature $Tc=90$–$120K$) are known.

The most important technique in a case where such a material is used as a Josephson device as an electronic device, is formation of a Josephson junction by a vapor deposition method, a sputter vapor deposition method or laser ablasion.

However, it is known that in the above mentioned material, the coherent length is very short. It was thought that for a good Josephson Junction, the size of the disorder at the interface-should be less than the coherent length. The surface tends to readily deteriorate. Therefore, when a Josephson junction is formed by laminating thin films of such a material with an interlayer interposed therebetween to form a space, the lattice matching between the superconductor material and the interlayer tends to be poor, and there are drawbacks such that the properties of the adjacent superconductor layers tend to deteriorate or a leakage current from the interlayer is likely to be observed. It is difficult to obtain a S/N/S (superconductor/normal conductor/superconductor) junction with good reproducibility, or even in the case of a S/I/S (superconductor/insulator/superconductor) junction, a leakage current is likely to result, or a superconducting connection tends to be hardly obtained.

To solve such drawbacks, the following methods (a) to (c) have been proposed, for example, in the case of a laminated thin film device.

(a) A method wherein an insulating film is formed on an oxide superconductor, and then a conventional type (phonon type) superconductor (such as Nb or a Nb type alloy, or Pb or a Pb compound) is laminated thereon.

(b) A method wherein a metal superconductor material having a relatively small amount of oxygen or a material commonly used for a substrate such as MgO, $SrTiO_3$ or $ZrO_2$, is laminated as an interlayer on an oxide superconductor and a superconductor is laminated thereon.

(c) A method wherein on an oxide superconductor, an insulator layer is formed by substituting the rare earth element or alkaline earth metal of such an oxide superconductor by other atoms, and an oxide superconductor is laminated on such an insulator layer.

However, in the case of the above method (a), a conventional superconductor is employed, whereby there is a problem that the thin film device can be operated only at a temperature corresponding to the temperature of liquefied helium.

Method (b) has a problem that in the case where a metal superconductor material having a relatively small amount of oxygen is used as the interlayer, it is difficult to obtain a sharp interface since the controllability of the diffusion of oxygen during annealing tends to be poor, or in the case where a substrate material like MgO is employed, it tends to be difficult to obtain a film having good properties because of the diffusion of Mg or the like.

Method (c) has a problem that since the bond between the superconducting Cu—O layer and the rare earth element or the like is weak, and the above mentioned substitution must be conducted in a large amount (at least 50%) in order to convert the superconducting properties to the insulating properties.

The present inventors have conducted extensive research with an aim to solve the above problems and have found a method whereby a S/N/S or S/I/S structure can be prepared without substantially changing the structure of the oxide superconductor.

Namely, the present invention has been accomplished by paying a particular attention to the specificity of the basic structure of an oxide superconductor containing Cu, particularly to the two dimensional characteristic thereof.

SUMMARY OF THE INVENTION

The present invention provides a thin film device comprising a substrate and an oxide superconductor film formed thereon, wherein said oxide superconductor film comprises atomic monolayers each composed of at least one kind of element of the oxide superconductor, which are deposited substantially in a vertical direction to the substrate so that the periodicity of the lattice structure of the oxide superconductor is substantially maintained, and at an intermediate portion of the oxide superconductor film, at least a part of the atoms of the oxide superconductor is substituted by another element in the lattice structure of the oxide superconductor to form a non-superconductor interlayer, and the periodicity of the lattice structure of the oxide superconductor film is substantially maintained across the interface between the oxide superconductor and said non-superconductor interlayer.

By the term "non-superconductor" is meant an insulator, semiconductor, compounds which do not undergo super-conducting transition, or whose super conducting temperature is below operating temperature.

Now, the present invention will be described in detail with reference to the preferred embodiments.

Specifically, the above oxide superconductor film is, for example, an oxide superconductor film containing Cu—O layers, which is composed of e.g. $LA_2Cu_3O_{7-\delta}$ wherein L is a rare earth element, A is an alkaline earth metal and $0 \leq \delta \leq 0.5$, $TlBa_2-_xCa_{n-1+x}Cu_nO_{2n+3}$ wherein n is 1, 2 or 3, and $0 \leq x \leq 0.5$ or $Bi_2Sr_{x-}Ca_yCu_nO_{2n+4}$ wherein n is 1, 2 or 3, $x+y \cong n+1$.

In the present invention, at an intermediate portion of such an oxide superconductor film, a part or whole of such Cu is substituted by another element to form a non-superconductor interlayer. As such a substituting element, an element of Group IIb in the Periodic Table, an element of Group IIIb in the Periodic Table or a transition element other than Cu, may be employed.

When the above oxide superconductor is composed of $LA_2Cu_3O_{7-\delta}$ wherein L is a rare earth element, A is an alkaline earth metal, and $0 \leq \delta \leq 0.5$ at non-superconductor interlayer of the oxide superconductor film, a part or whole of such L may be substituted by another rare earth element or alkaline earth metal element.

Further, when the above oxide superconductor film is composed of $TlBa_2{}_{-x}Ca_{n-1+x}Cu_nO_{2n+3}$ wherein n is 1, 2 or 3 and $0 \leq x \leq 0.5$, or $Bi_2Sr_xCa_yCu_nO_{2n+4}$ wherein n is 1, 2 or 3, and $x+y \simeq n+1$, at an intermediate portion of the oxide superconductor, a part or whole of Ca may be substituted by another alkaline earth metal or a trivalent rare earth element such as Y. For the preparation of such an oxide superconductor film, a method such as molecular beam deposition (MBE), laser ablasion or a vapor deposition method by means of electron beams or heating by resistance.

Further, as a specific method for depositing the atomic monolayers for the oxide superconductor film substantially in a vertical direction to the substrate so that the periodicy of the lattice structure of the oxide superconductor will be formed as described above, a method similar to the one employed in the conventional art for the preparation of a super-lattice, may be employed.

As such a specific method, there may be mentioned a method in which the respective atomic monolayers constituting the oxide superconductor film and non-superconductor interlayer are sequentially deposited one after another, for example, in the case of YBCO which is commonly known as $YBa_2Cu_3O_{7-\delta}$ and $0 < \delta < 1$, in the order of BaO, CuO, BaO, CuO, Y, CuO, that is to say a layer by layer vapor deposition method.

Otherwise, it is, of course, possible to employ a method wherein the respective block layers constituting the oxide superconductor film are sequentially deposited by vapor deposition. In this case, for example, in the case of $YBa_2Cu_3O_7$, the vapor deposition may be conducted in the order of $BaCuO_2$, $YCuO_{2.5}$ and $BaCuO_2$. Further, in the case of $Bi_2SR_2CaCu_2O_8$, the film can be prepared by conducting the deposition in the order of $Bi_2O_2$—$SrCuO_2$—$CaCuO_2$—$SrCuO_2$(—Cu), as described in the article by Kawai, Adachi, et al in JJAP 27 (1988) 21883.

DETAILED DESCRIPTION OF THE PREFERRED EMBODIMENTS

Figure 1A:
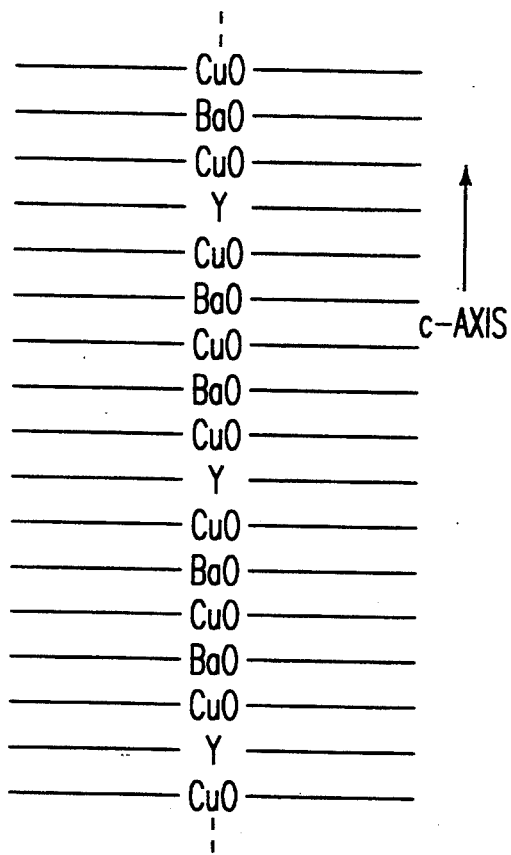
FIG. 1(A) is a view illustrating the basic structure of an oxide superconductor of YBCO type having a c-axis orientation.

In an actual thin film device, current contacts are provided independently at the upper and lower portions of the modulated portion where at least a part of atoms is substituted at an intermediate portion (interlayer) of the oxide superconductor film. Therefore, after the preparation of the above mentioned oxide superconductor layer, etching treatment is conducted to expose the lower superconductor portion $S_1$ as shown in FIG. 4, or after preparation of the lower superconductor portion $S_1$ or, in some cases, after preparation of a modulated portion D, masking is conducted to expose a part of the lower superconductor portion $S_1$ and to have the rest covered by the modulated portion D and the upper superconductor portion $S_2$. FIGS. 1(B)–(D), FIGS. 2(B)–(C) and FIGS. 3(B)–(C) illustrate enlarged sections of the portion of the thin film device which corresponds to box Z shown in FIG. 4 with dotted lines.

In the present invention, the laminated structure may, for example, be of a type S/I/S/I/S or S/N/S/I/S, and other known structure may be deposited on or under the thin film device.

For example, in the research article by Mr. Kawai in ISTEC Journal 2 (3) 1989, p. 19, preparation of a super lattice structure by laser ablasion is explained. However, the purpose of this research is to study the dimensional nature of a superconductor or to prepare a super lattice structure, and it is different in the structure from the preparation of the above mentioned hetero interface according to the present invention.

Namely, in the present invention, such a technique for the preparation of a superlattice is utilized, but the present invention is based on the recognition that the substituted portion (interlayer) where a rare earth element or Cu in a YBCO type oxide superconductor, or an alkaline earth metal or Cu in a Bi type oxide superconductor, is substituted by other element, is present in the crystal structure with the original crystal structure maintained in a stabilized state, and on the knowledge that this substituted portion (interlayer) exhibits an insulating property or a normal conductivity property required for a Josephson junction.

Heretofore, an S/I/S structure such as $YBa_2CuO_7$/$(Ypr)Ba_2Cu_3O_7$/$YBa_2Cu_3O_7$ has been studied. However, such a study was based on a conventional hetero deposited film and is not directed to the one formed by locally modulating the original composition of the YBCO type oxide superconductor film.

Namely, a conventional crystal structure such as $YBa_2Cu_3O_7$ or $Bi_2SR_2CaCu_2O_{8-\delta}$ and $0 \leq \delta \leq 0.5$ is stable within a wide temperature range from a very low temperature (4K) to a high temperature ($\sim 600°$ C.). However, a conventional hetero structure is prepared by destroying such a stable structure across the interface between the oxide superconductor and said non-superconductor interlayer, and with such a conventional structure, control of the interface between layers of different types can not satisfactorily be conducted. It has been difficult to prepare a thin film device having a thermodynamically stable structure and interface without disorder.

Whereas, according to the present invention, the electrical properties substantially the same as the above mentioned conventional hetero structure can be obtained while maintaining the original stable crystal structure substantially completely, and the composition of the modulated portion employed can be present in the form of a stable film since the crystal structure of the modulated portion is thermodynamically stable like the oxide conductor as the basic composition. Therefore, according to the present invention, it is possible to obtain a thin film device which is free from the above mentioned conventional problems and which has a high operational temperature and excellent properties.

Now, the present invention will be described in further detail with reference to Examples. However, it should be understood that the present invention is by no means restricted to such specific Examples.

The feature of the present invention resides solely in the layer structure, and the following description will be directed solely to the layer structure.

FIG. 1(A) illustrates the basic structure of a YBCO type oxide superconductor film having a c-axis orientation, in which a basic cycle of BaO—CuO—BaO—CuO—Y—CuO is repeated. However, due to formation of defects, a part of this basic cycle may locally break.

Figure 1B:
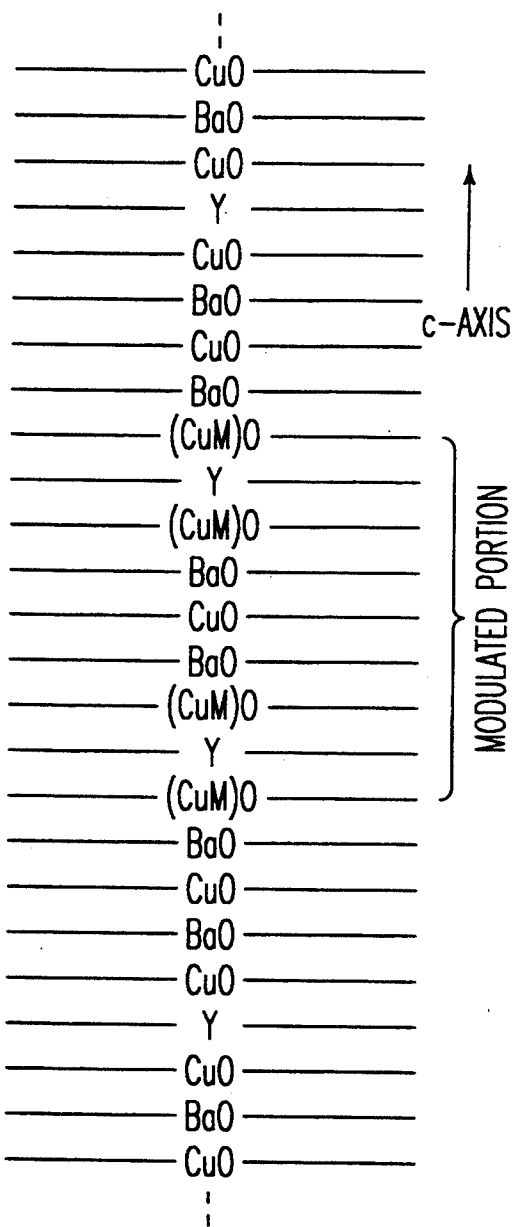
FIGS. 1(B), 1(C) and 1(D) are views likewise illustrating the structures of the present invention.

Shown in FIG. 1(B) is an Example of the present invention relating to the above film having a c-axis orientation, which has such a structure that at an intermediate portion of the structure of FIG. 1(A), Cu $O_2$ layers are substituted by $CuMO_2$, so that a modulated portion is formed as illustrated by * in FIG. 1(B). This modulated portion is introduced in the above basic cycle of BaO—CuO—BaO—$CuO_2$—y—$CuO_2$ superconducting film so that the periodicity of the above basic cycle :BaO (transition metal)-O—BaO-(transition metal)-$O_2$-Rare Earth-(transition metal)-$O_2$ is substantially maintained and a non-superconducting interlayer is formed in the modulated portion. Here, M may be an element of Group IIb in the Periodic Table such as Zn, an element of Group IIIb in the Periodic Table such as Al or Ga, or a transition element other than Cu, such as Cr, Fe, Co, Ni, Zr or Pt, and it is preferably an element having an ion radius which does not substantially differ from Cu.

The length of the above modulated portion is usually required to be longer than the superconductor coherent length and not very much (e.g. ten times) longer than the coherent length. An oxide having a critical temperature TC of at least the liquefied nitrogen temperature (77K) has an anisotropy, but typically, the coherent length is about 10 Å or less. Therefore, the length of the modulated portion is preferably within a range of from the minimum basic structural unit (c-axis length) to ten times the c-axis length, i.e. from 10 to 100 Å for S/I/S structure. The superconductor layers above and below the modulated portion may usually be from 50 to 1,000 Å.

Figure 1C:
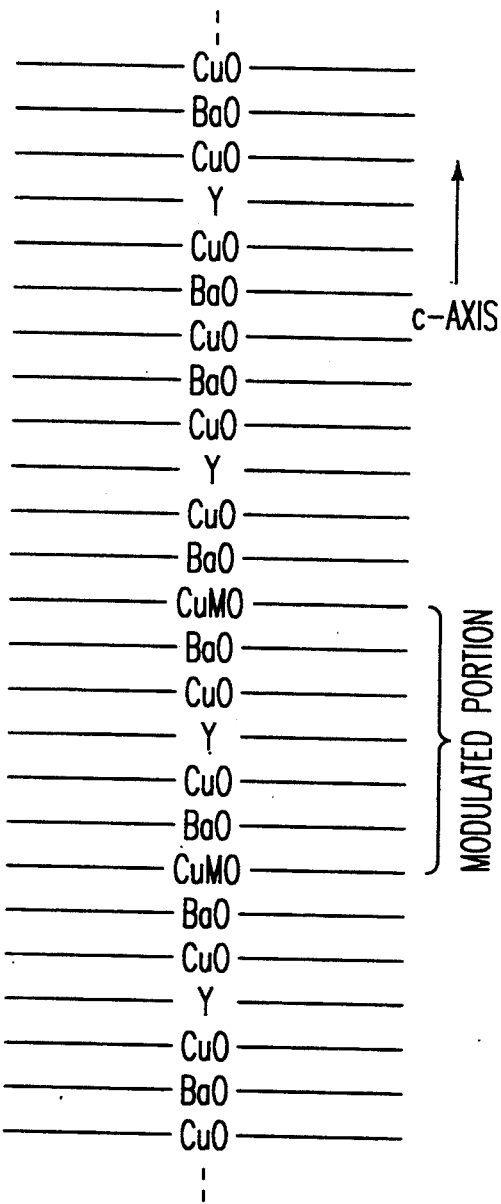

FIG. 1(C) illustrates another Example of the modulation of a film having a c-axis orientation. In this Example, not a $CuO_2$ plane, but a CuO chain is substituted by CuMO.

Figure 1D:
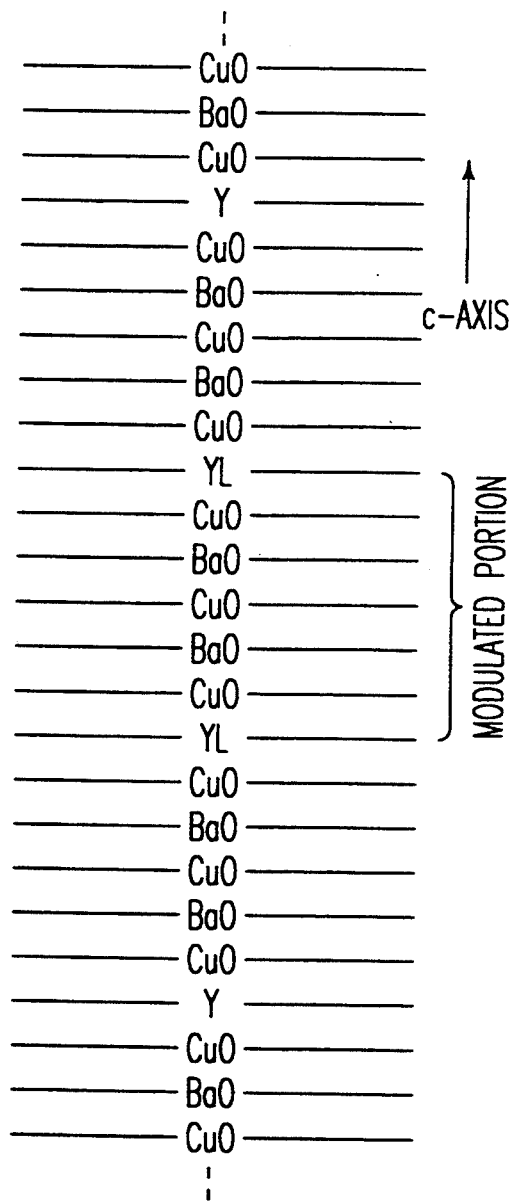

FIG. 1(D) illustrates an Example wherein Y is substituted by YL where L is a rare earth element other than Y having a different valence, such as $Ce^{4+}$ or $Pr^{4+}$.

This substitution may be conducted by an alkaline earth metal such as $Ca^{2+}$.

Figure 2A:
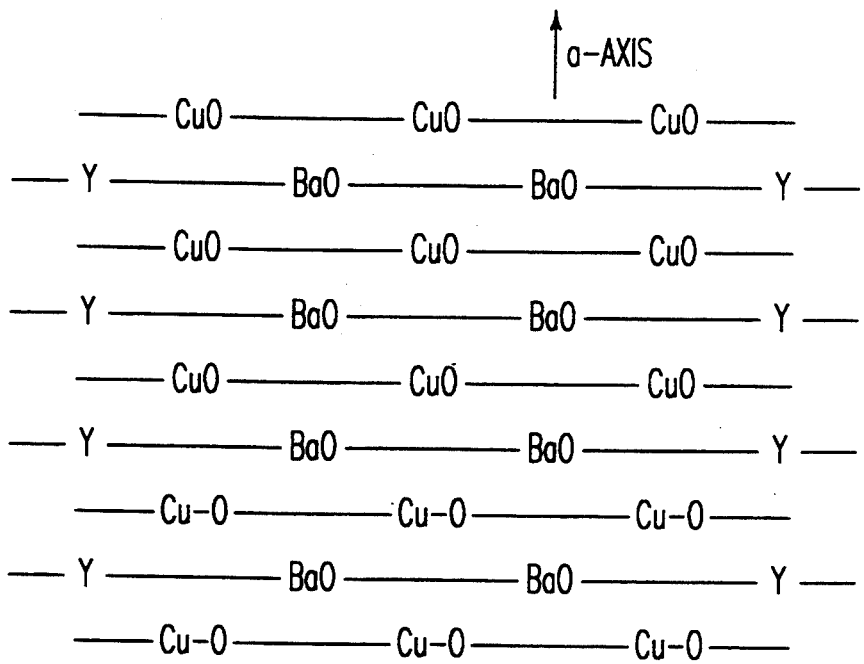
FIG. 2(A) is a view illustrating the basic structure of an oxide superconductor of YBCO type having an a-axis orientation.

FIG. 2(A) illustrates the basic structure of a YBCO type oxide superconductor film having an a-axis orientation, wherein a basic cycle of $YBa_2O_2$—$Cu_3O_5$ is repeated. In a thin film device of the present invention, modulation is conducted so that this basic cycle is maintained.

Figure 2B:
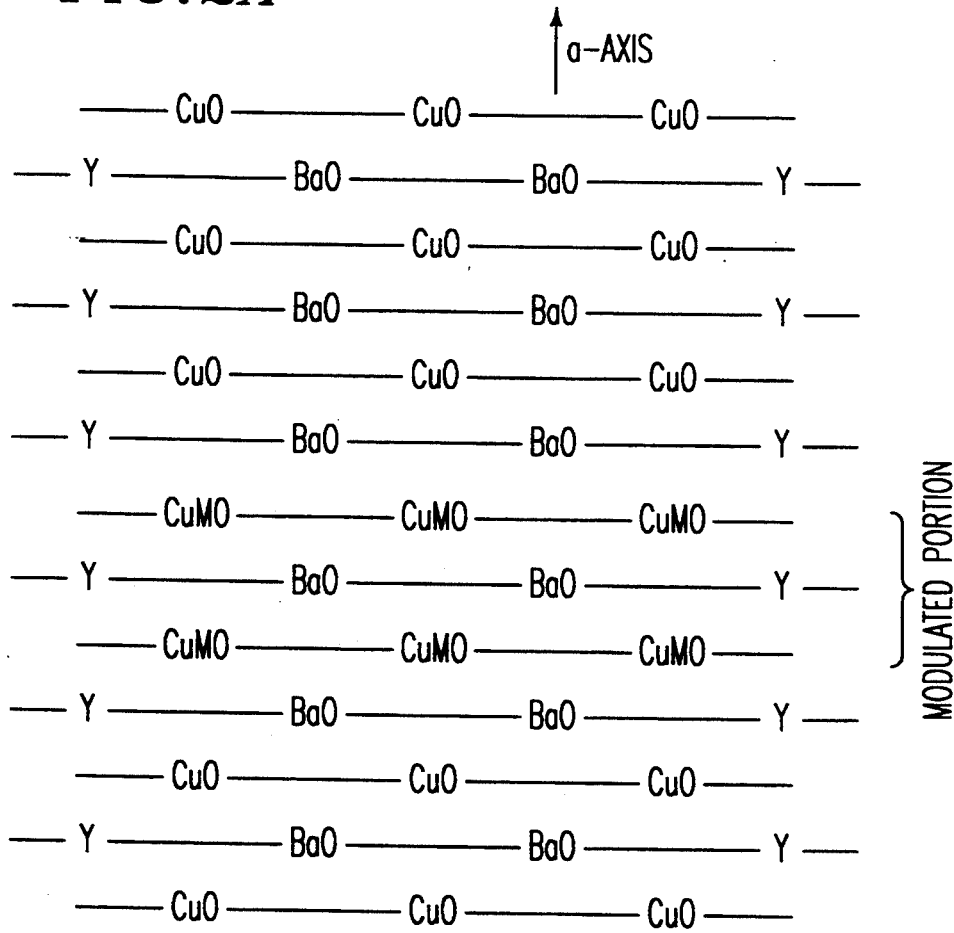
FIGS. 2(B) and 2(C) are views likewise illustrating the structures of the present invention.
Figure 2C:
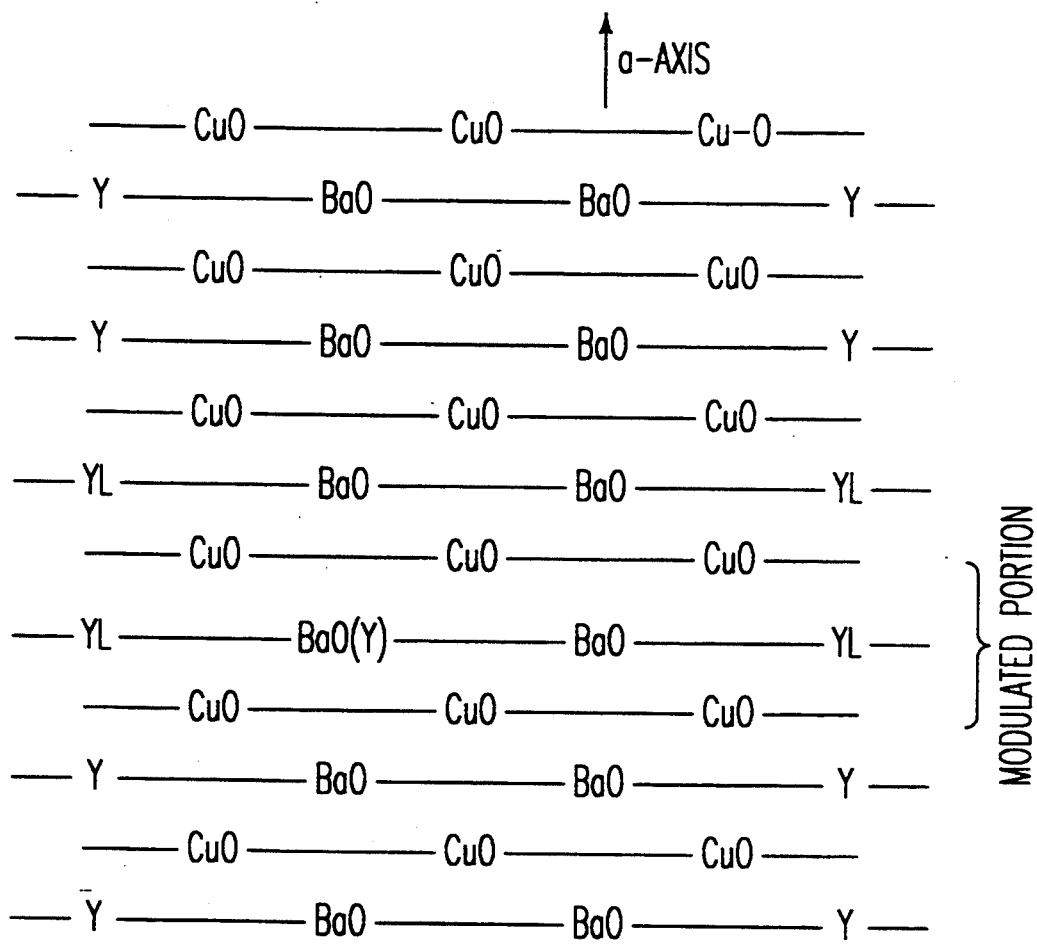

Namely, FIGS. 2(B) and (C) illustrate Examples of the present invention relating to this film having an a-axis orientation. The Example of FIG. 2(B) has a structure wherein at an intermediate portion, CuO and $CuO_2$ layers are substituted by CuMO and $CuMO_2$, respectively, and a modulated portion is formed as illustrated by * in FIG. 2(B). FIG. 2(C) illustrates an Example wherein Y in Y—$Ba_2O_2$ layers is substituted by YL where L is a rare earth element other than Y.

Figure 3A:
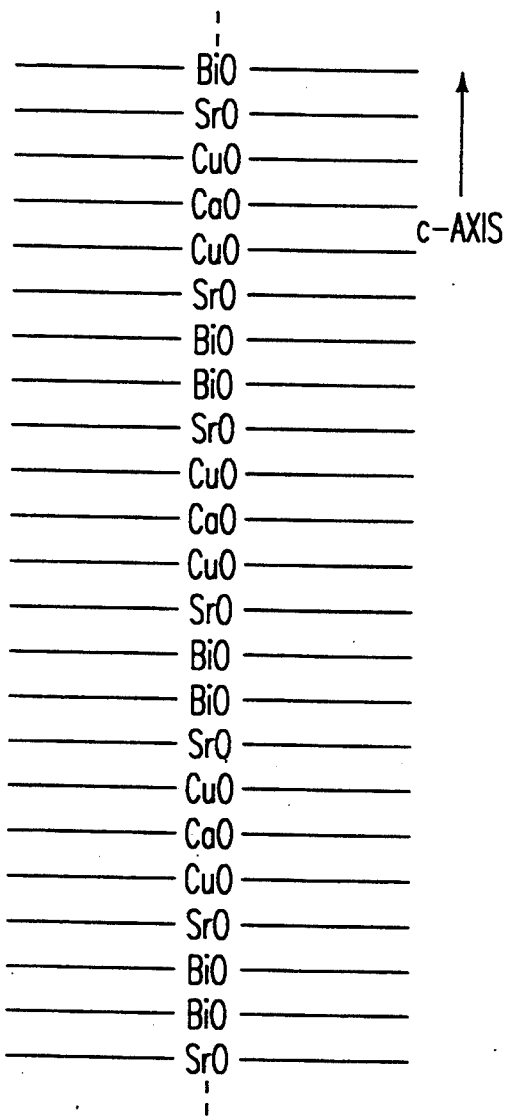
FIG. 3(A) is a view illustrating the basic structure of $Bi_2SR_2CaCu_2O_{2n+4+\delta}$.

FIG. 3(A) illustrates the basic structure of a $Bi_2SR_2CaCu_2O_{2n+4+\delta}$ film having a c-axis orientation, wherein a basic cycle of BiO—SrO—$CuO_2$—Ca—$CuO_2$—SrO—BiO is repeated.

Figure 3B:
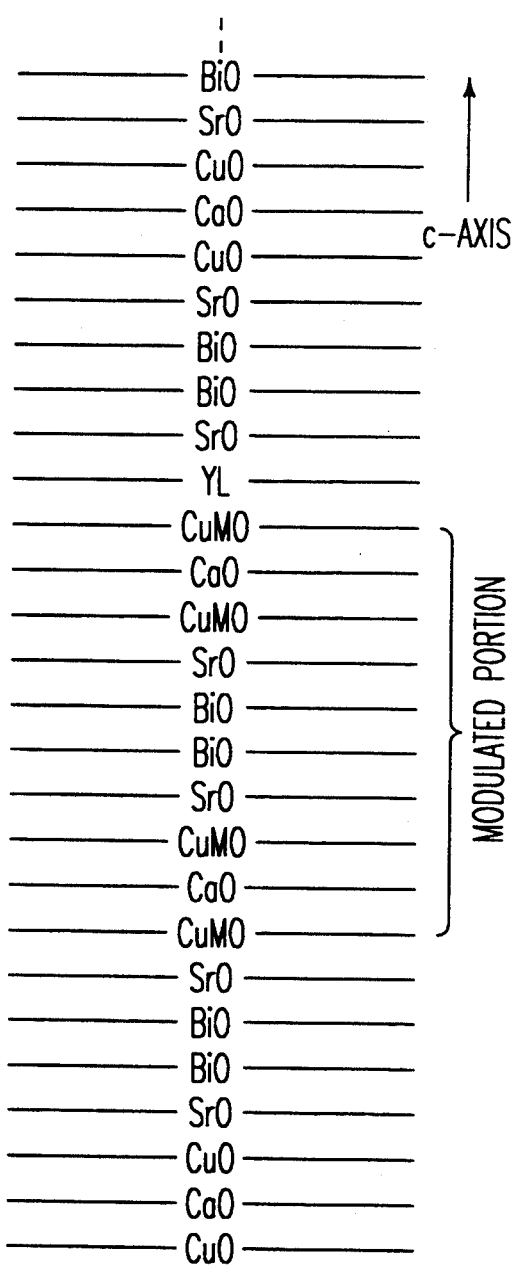
FIG. 3(B) is a view illustrating the same structure in which Cu is substituted by CuM.

And, a thin film device of the present invention shown in FIG. 3(B) has a structure in which a part of Cu is substituted by CuM, and a modulated portion is formed between two layers of CuMO (=$Cu_{1-x}M_x$—$O_2$) and $0.1 \leq x \leq 0.5$. In the Example shown in FIG. 3(C), a part of Ca is substituted by Y, and a modulated portion is formed as illustrated by * in FIG. 3(C).

Figure 3C:
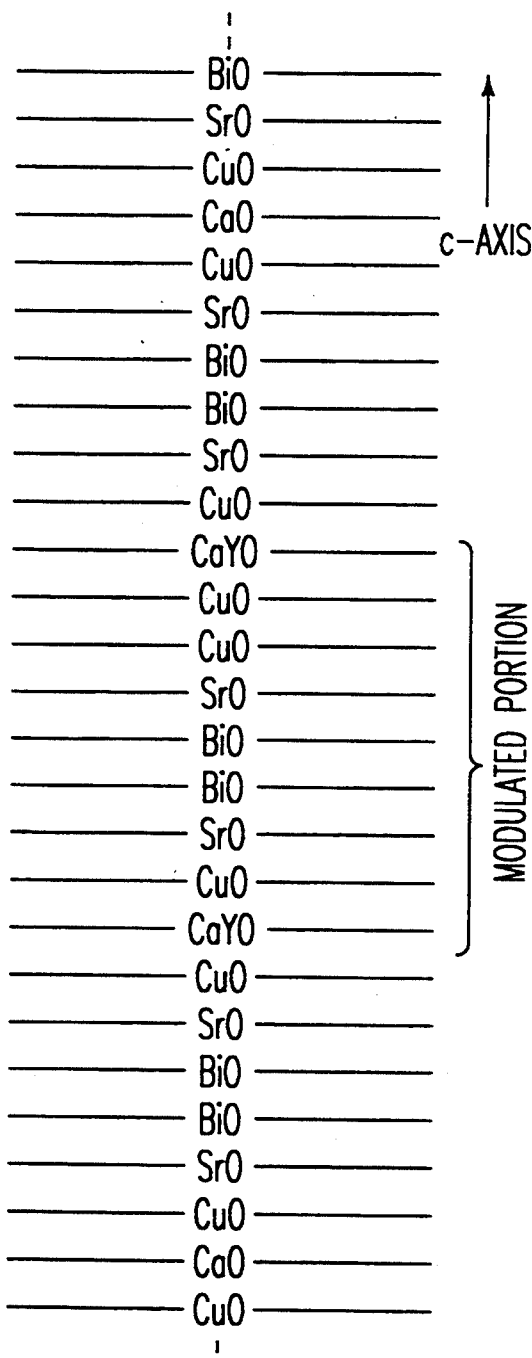
FIG. 3(C) is a view likewise illustrating a case wherein Ca is substituted by CaY.
Figure 4:
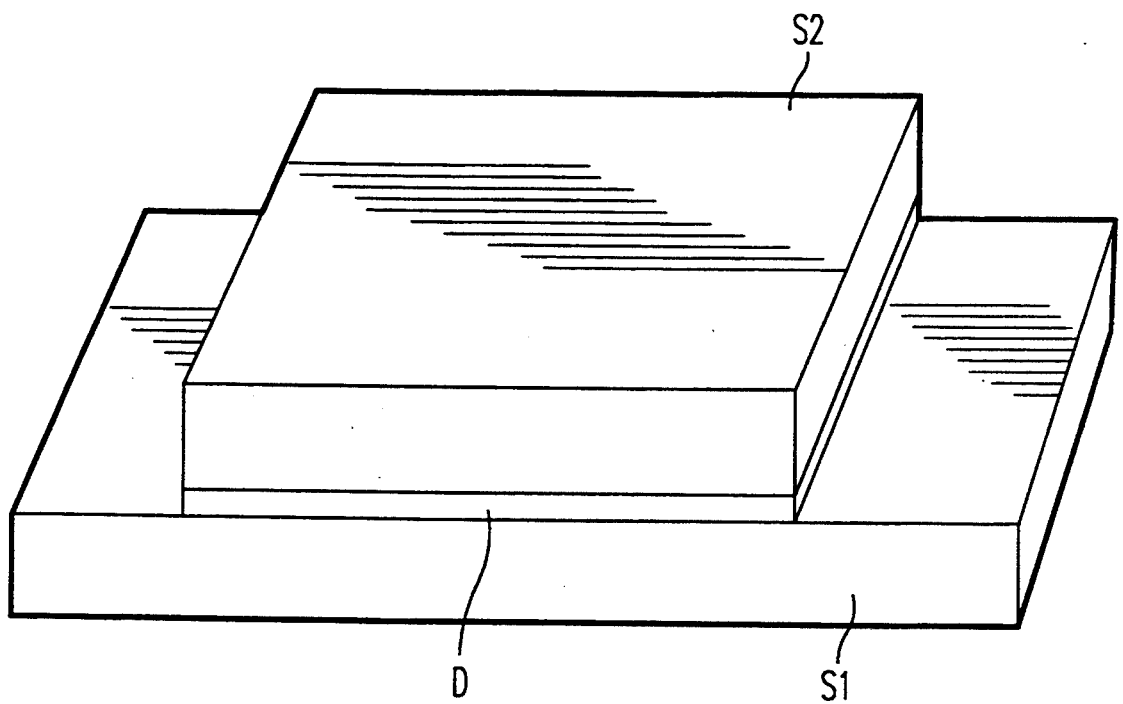
FIG. 4 is a view illustrating an embodiment of the laminated structure of a thin film device of the present invention.

In a case of an oxide superconductor of Tl—Ba—Ca—Cu—O type, the structure may be the same as that of FIGS. 3(A) to (C) where Bi is changed to Tl, and Sr is changed to Ba.

Two or more of the above-described various manners for the substitution of elements, may be combined as the case requires. For example, in a case of an oxide superconductor film of YBCO type, the manners for substitution as illustrated in FIG. 1(B) and FIG. 1(C) may be combined simultaneously.

Figure 5:
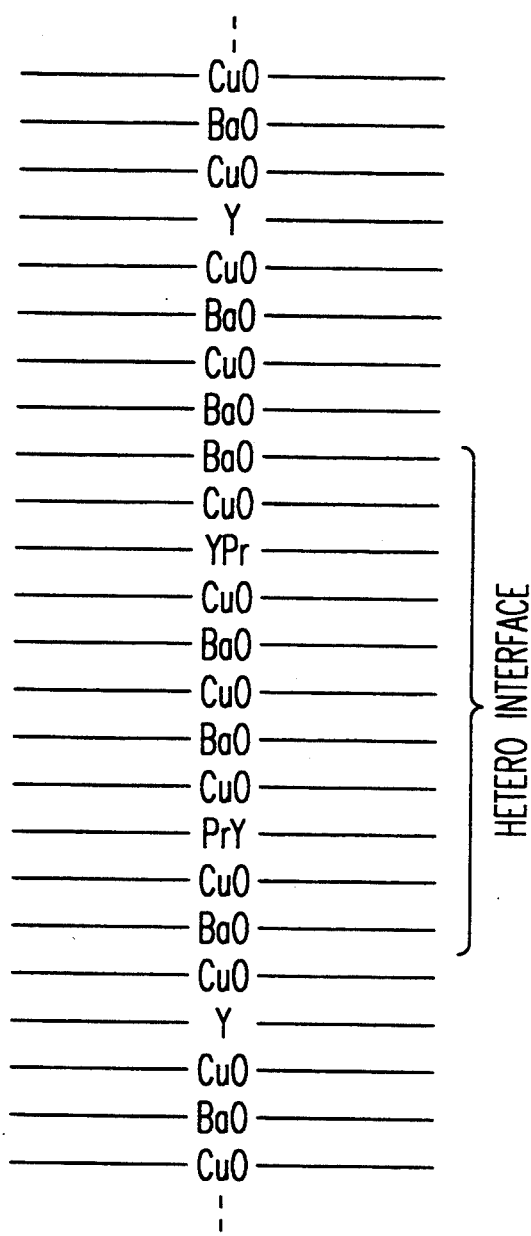
FIG. 5 is a view illustrating a conventional hetero epitaxial growth in an oxide superconductor of YBCO type.

FIG. 5 illustrates an Example of a conventional hetero epitaxial growth in a thin film device composed of an oxide superconductor film of YBCO type. In the Figure, a hetero interface is formed between two BaO layers. Thus destroying the periodicity of structure of the oxide super conductor.

EXAMPLE 1

An oxide superconductor film of YBCO type was formed by vapor deposition using electron beam and resistance heating source, on a $SrTiO_3$ (001) substrate in an atmosphere of an oxygen partial pressure of $3 \times 10^{\times 4}$ torr, as follows.

Namely, control of the thickness of each layer was conducted by adjusting the applied power and time while detecting the layer thickness by a crystal oscillation type layer thickness monitor. First, a BaO layer was vapor-deposited on the substrate by opening and closing the shutter, then one layer of Cu was vapor-deposited thereon, and vapor deposition of BaO, Cu, $Y_2O_3$, Cu and BaO atomic monolayers was further conducted sequentially in this order. This vapor deposition was repeated 30 times to form a $YBa_2Cu_3O_x$ ($6.5 \leq x \leq 7.0$) film. The substrate temperature was 700° C., and the vapor deposition rate of each layer was 10 Å/min.

Thereafter, the film device was maintained under an oxygen partial pressure of 100 torr for 5 hours, and then cooled to room temperature at a rate of 50° C./min.

The obtained film showed zero resistance at 87K, and from the X-ray diffraction, it was found to be a film having an excellent c-axis orientation.

Then, in the same manner as described above, a $YBa_2Cu_3O_x$ ($6.5 \leq x \leq 7.0$) film composed of 30 lattices was prepared, and then using $Co_{0.5}Cu_{0.5}$ instead of Cu, layer-forming by similar vapor deposition was repeated for five cycles to obtain a $YBa_2(Cu_{0.5}Co_{0.5})_3O_x$ ($6.5 \leq x \leq 7.5$) film.

Then, using BaO, $Y_2O_3$ and Cu again, vapor deposition for 20 lattices was repeated to obtain a $YBa_2Cu_3O_x$ ($6.5 \leq x \leq 7.0$) film.

This film was maintained under an oxygen partial pressure of 100 torr for 5 hours in the same manner as described above, and then cooled to room temperature at a rate of 50° C./min. The resistance in the film surface of the film thus obtained was measured, whereby it was found that zero resistance was obtained at 87K.

Further, from the X-ray diffraction, an excellent c-axis orientation was also confirmed. Thus, it is evident that Co did not diffuse into the superconducting portions at both sides and a thin film device having excellent properties was obtained.

EXAMPLE 2

Under the same manner and the same conditions as in Example 1, $YBa_2CuO_7$, $(Pr_{0.5}Y_{0.5})Ba_2CuO_7$ obtained by changing Y in $YBa_2CuO_7$ to $(Pr_{0.5}Y_{0.5})$, and $YBa_2CuO_7$, were sequentially layer by layer deposited on a $SrTiO_3$ (001) substrate surface to obtain a think film device of the present invention.

This film was maintained under an oxygen partial pressure of 100 torr for 5 hours in the same manner as in Example 1, and then cooled to room temperature at a rate of 50° C./min. The resistance in the film surface of the film thus obtained was measured, and the X-ray diffraction was analyzed, whereby it was found to be a thin film device having excellent properties like in Example 1.

As described in the foregoing, according to the present invention, a thin film device having a high operational temperature and excellent properties can be prepared without any problems of the above mentioned conventional techniques.

I claim:

1. A method of forming a thin film device, comprising a substrate and a copper oxide superconducting film formed thereon, wherein the copper oxide superconducting film comprises atomic monolayers each composed of at least one element of an oxide superconductor, which method comprises vapor depositing said atomic monolayers of said copper oxide superconducting film layer-by-layer substantially in a perpendicular direction to the substrate so that periodicity of the atomic monolayers and the layer structure of the copper oxide superconducting film is substantially maintained, wherein said copper oxide superconducting film has a non-superconducting interlayer at a intermediate portion of said film, and wherein at least one of the elements in the atomic monolayer of the copper oxide superconductor is substituted by an element other than copper, to form said non-superconducting interlayer, the periodicity of the atomic monolayers in the layer structure of the copper oxide superconducting film being substantially maintained to cross an interface between the copper oxide superconductor and said non-superconducting interlayer.

2. The method of claim 1, wherein the copper oxide superconducting film is composed of a material selected from the group consisting $LA_2Cu_3O_{7-\delta}$, wherein L is a rare earth element, A is a alkaline earth metal, and $0 \leq \delta \leq 0.5$, $TlBa_{2-x}Ca_{n-1+x}Cu_nO_{2n+3}$, wherein n is 1, 2 or 3, $0 \leq x \leq 0.5$, $Bi_2Sr_xCa_yCu_nO_{2n+4}$, wherein n is 1, 2 or 3, and $x+y=n+1$.

3. The method of claim 1, wherein said element other than Cu is selected from the group consisting of an element of group IIb in the Periodic Table, an element of group IIIb in the Periodic Table and a transition element other than Cu.

4. The method of claim 1, wherein the copper oxide superconducting film is composed of $LA_2Cu_3O_{7-\delta}$, wherein L is a rare earth element, A is an alkaline earth metal, and at least a portion of element of L is substituted by another rare earth element or alkaline earth metal in said non-superconducting interlayer.

5. The method of claim 1, wherein the copper oxide superconducting film is composed of $TlBa_{2-x}Ca_{n-1+x}Cu_nO_{2n+3}$, wherein n is 1, 2 or 3, and $0 \leq x \leq 0.5$, or $Bi_2Sr_xCa_yCu_nO_{2+4}$, wherein n is 1, 2 or 3, and $0 \leq x \leq 0.5$, and $x+y \approx n+1$, and at the non-superconducting interlayer of the oxide superconducting film, at least a portion of Ca is substituted by another alkaline earth metal or trivalence earth metal.

6. The method of claim 1, wherein said thin film device is a Josephson device designed to conduct an electric current in the thickness direction of the superconductor film.

* * * * *